TRANSISTORIZED DIFFERENTIAL AMPLIFIER UTILIZING COMPONENTS EASY TO FABRICATE USING THIN FILM CIRCUITRY TECHNIQUES
Filed Nov. 30, 1965
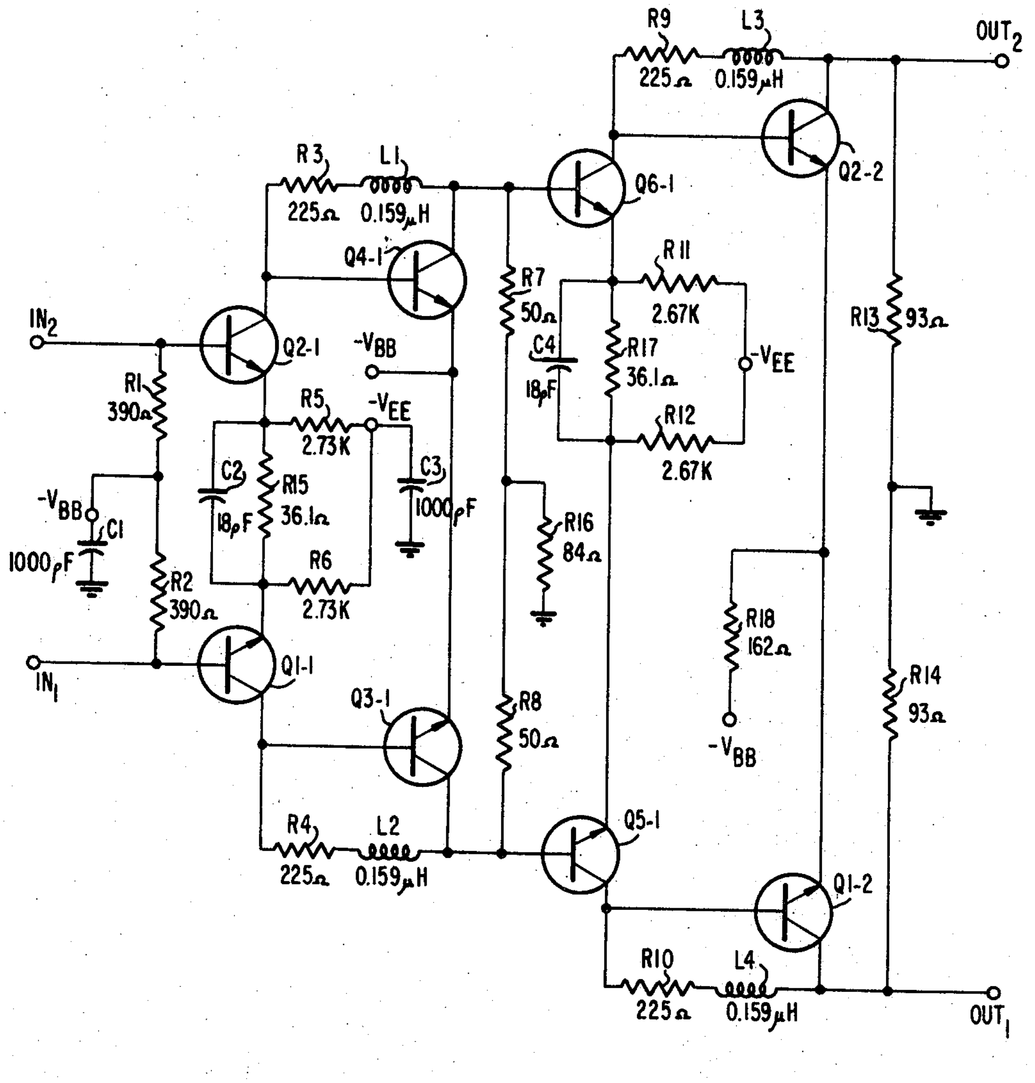
INVENTOR
JUNE SINGLETARY, JR.
BY Hughes, Rothwell, Mion, Zinn & Macpeak
ATTORNEYS

United States Patent Office 3,496,480

Patented Feb. 17, 1970

3,496,480

TRANSISTORIZED DIFFERENTIAL AMPLIFIER UTILIZING COMPONENTS EASY TO FABRICATE USING THIN FILM CIRCUITRY TECHNIQUES

June Singletary, Jr., Raleigh, N.C., assignor to Corning Glass Works, Corning, N.Y., a corporation of New York Filed Nov. 30, 1965, Ser. No. 510,489

Int. Cl. H03f *3/68*

U.S. Cl. 330—30 9 Claims

ABSTRACT OF THE DISCLOSURE

A transistorized differential amplifier which possesses the qualities of low noise, high frequency response, prevention of the D.C. buildup in the several stages of amplification, and utilizes entirely components which can be fabricated easily by thin film circuitry techniques.

The invention relates to transistorized differential amplifiers, and more particularly to transistorized differential amplifiers consisting entirely of components which are easy to fabricate using thin film circuitry techniques.

Transistorized differential amplifiers and their uses are well known in the art and typically include a plurality of stages of differential amplification. Some of the requirements in designing transistorized differential amplifiers are low noise, good high frequency response, and prevention of the D.C. buildup in the several stages of amplification. The present invention achieves low noise operation, good high frequency response, and prevention of D.C. buildup without using any tunnel diodes, Zener diodes, PNP transistors, coupling capacitors or inductors larger than 0.2 microhenry. The prior are transistorized differential amplifiers have included some or all of the above parameters.

Amplifiers including the above mentioned components are suitable for many applications, but are not amenable to thin film fabrication. In the last few years, great emphasis has been placed on reducing the size of electronic circuits, and therefore much attention has been given to the fabrication of entire circuits by thin film techniques. Coupling capacitors and inductors of values larger than 0.2 microhenry make thin film fabrication prohibitive due to the large surface area required. Tunnel diode chips, Zener diode chips, and PNP transistor chips can be applied to thin film circuits but they multiply the cost of automating such an operation.

In the present invention, all of the above components are eliminated, thereby resulting in a circuit easily fabricated by thin film techniques, and the low noise operation, high frequency response, and prevention of the D.C. buildup are accomplished by new designs which eliminate the prior need for the above mentioned components in forming a transistorized differential amplifier. In a preferred embodiment, the invention comprises four stages of differentially connected NPN transistors, each stage being coupled directly to the next stage rather than being coupled by large coupling capacitors. Good high frequency response is achieved in the first and third stages by connecting a very small capacitance in parallel with the gain determining impedance, thereby offsetting the normal decrease in gain at very high frequencies due to the parasitic elements in the first and third stage transistors. Good high frequency response is achieved in the second and fourth stages by providing a low valued feedback inductance between the collector and base of each transistor in those stages. Low noise operation and D.C. buildup prevention is achieved in the first and second stages by causing the bias on the first and third stage transistor collectors to be held above the bias on the first and third stage transistor bases by an amount equal to the forward base emitter voltage drop of the second and fourth stage transistors, respectively. Also, the D.C. bias on the collectors of the second and fourth stage transistors are held just above the D.C. bias on their base terminals by means of a low valued resistance connected in the feedback path between the collector and base of each transistor.

It is therefore an object of the present invention to provide a transistorized differential amplifier consisting only of components which are easy to fabricate by thin film techniques.

A further object of the present invention is to provide a new and improved NPN transistorized differential amplifier having good high frequency response.

Another object of the present invention is to provide a transistorized differential amplifier having four stages which are directly connected to one another in succession.

The foregoing and other objects, features and advantages of the invention will be apparent from the following more particular description of a preferred embodiment of the invention, as illustrated in the accompanying drawing, wherein the only figure is a schematic diagram of a preferred embodiment of the invention.

Referring to the drawing, the differential amplifier as shown having the listed component values and wherein $-V_{BB}=-3V$ and $-V_{EE}=-12V$ has the following characteristics:

amplifier rise time of 6 ns.
voltage gain ratio with a 1.0 mv. input of 40
a 3 db bandwidth of 60 mc.
a temperature range of $+15°$ to $+55°$ C.

The only requirements on the transistors is that the transistors of any given stage be identical and all transistors must have a beta of 20 or greater. However, to provide the performance just enumerated the transistors used must meet the following specifications:

| | |
|---|---|
| $f_T \geq 0.6\times10^9$ c./s. | Frequency where current gain drops to unity. |
| $r_b \leq 30$ ohms | Base spreading capacitance. |
| $C_{obo} \leq 4.3\times10^{-12}$ F. | Collector to base capacitance with emitter open-circuited. |
| Beta$\geq$40 | D.C. current gain. |

The differential amplifier of the present invention comprises four stages of differentially connected NPN transistors. The first stage includes NPN transistors $Q_{2-1}$ and $Q_{1-1}$. The emitters of the first stage transistors are connected to a gain determining impedance $R_{15}$ and also connected to the $-V_{EE}$ power supply terminal through resistors R5 and R6 respectively. Capacitor $C_2$, which is a very small capacitor, 18 picofarads, in the example shown, is connected in parallel with impedance $R_{15}$. The base terminals of the first stage transistors are connected to the two amplifier inputs, $IN_1$ ann $IN_2$, respectively. The bases are also connected through low valued resistances $R_1$ and $R_2$, respectively, to low voltage power supply terminal $-V_{BB}$.

The collectors of the first stage transistors serve as the first stage output terminals and are connected directly to the bases of the second stage transistors, $Q_{4-1}$ and $Q_{3-1}$, which serve as the second stage input terminals. The emitters of the second stage transistors are connected directly to the $-V_{BB}$ power supply terminal and the collectors are connected to the second stage inputs via feedback circuits comprising low valued resistances R3 and R4 and low valued inductances $L_1$ and $L_2$.

The collectors of the second stage transistors are connected directly to the bases of the third stage transistors, $Q_{6-1}$ and $Q_{5-1}$. The connection of resistances $R_7$, $R_8$ and $R_{16}$ serve as biasing resistors for the second and third stages. The emitters of the second stage transistors are connected to opposite sides of gain determining resistance $R_{17}$ and to the $-V_{EE}$ power supply terminal via resistances $R_{11}$ and $R_{12}$ respectively. A capacitance $C_4$, similar to capacitance $C_2$ in the first stage, is connected in parallel with resistance $R_{17}$.

The collectors of the third stage transistors serve as the third stage outputs and are connected directly to the bases of fourth stage transistors $Q_{2-2}$ and $Q_{1-2}$. A feedback connection of $R_9$ and $L_3$ is connected between the collector and base of $Q_{2-2}$, and a feedback connection of $R_{10}$ and $L_4$ is connected between the collector and base of $Q_{1-2}$. The emitters of the fourth stage transistors are connected to the $-V_{BB}$ power supply terminal through resistance $R_{18}$, and the collectors of the fourth stage transistors, which serve as the differential amplifier.

One of the problems in designing transistor amplifiers is to achieve minimum noise operation of the stages, particularly the first stage since its noise would be amplified by all succeeding stages, without risking saturation of any of the stages. Saturation is defined as that point at which an increased input does not lead to an increased output. It is apparent that if the D.C. biases on the differential amplifier stages cause saturation of the stages, a pulse input will not pass to the output. Saturation occurs in transistors when the collector to emitter voltage ($V_{CE}$) is less than the base to emitter voltage ($V_{BE}$). However, low noise operation is realized only when $V_{CE}$ barely exceeds $V_{BE}$ and when the transistor is operated at low current levels. Due to the requirements for preventing saturation and for achieving low noise operation it is necessary to maintain the collector bias only slightly above the base bias while at the same time ensuring that the collector bias does not drop below the base bias.

The above condition is achieved in the first stage by holding the D.C. bias on the collectors above the D.C. bias on the base by a value equal to the forward base emitter voltage drop of the second stage transistors. The selected parameters shown in the drawing cause a very small D.C. current to flow into the base of $Q_{2-1}$ and $Q_{1-1}$ (about 0.0002 amp). The current flows from the $-V_{BB}$ terminal, which in the example given is $-3$ volts. Since $R_1$ and $R_2$ are relatively small resistances, and further since the current flowing is very small, the voltage drops across $R_1$ and $R_2$ are insignificant when compared to the $-3$ volt terminal, and therefore the D.C. voltage at the base of $Q_{2-1}$ and $Q_{1-1}$ is substantially $-3$ volts. Since the transistors are all conducting at quiescent time, and since the $-V_{BB}$ terminal is connected to the collector of $Q_{2-1}$ through the base to emitter junction of $Q_{4-1}$, the collector bias of transistor $Q_{2-1}$ differs from the base bias by the forward base to emitter voltage drop of $Q_{4-1}$ The latter voltage drop is about 0.65 to 0.8 volt. Similar connections maintain the collector of $Q_{1-1}$ about 0.65 to 0.8 volt above its base.

The 0.65 to 0.8 voltage difference between the collector and base of each of the first stage transistors is low enough to achieve low noise level operation, and at the same time the design used to achieve the collector to base voltage difference always maintains the collector voltage above the base, thereby preventing saturation.

It should be noted at this point that 0.65 volt is much greater than the anticipated input pulse swing and therefore the added pulse amplitude will not saturate the transistor.

Low noise operation in the second stage is achieved through the use of a low valued resistance, $R_3$, in the feedback path between the collector and base of $Q_{4-1}$, and through the use of a low valued resistance, $R_4$ connected in the feedback path between the collector and base of $Q_{3-1}$. The D.C. base voltage on $Q_{4-1}$ is the same as the D.C. collector voltage on $Q_{2-1}$. The collector current of $Q_{2-1}$ is very small and is drawn through $R_{16}$, $R_{17}$ and $R_3$.

Since $R_3$ is a relatively low valued impedance and since the collector current of $Q_{2-1}$ is not too large, the collector of $Q_{4-1}$ is held only slightly above the base of $Q_{4-1}$ by the IR drop across the feedback resistance $R_3$. That connection not only prevents the collector of $Q_{4-1}$ from dropping below the base of $Q_{4-1}$, it also maintains the difference between the collector and base voltages at a relatively low value ensuring low level noise operation.

The D.C. bias connections which prevent D.C. buildup and ensure low level noise operation without risking saturation in the third and fourth stages is substantially identical to the circuitry explained with reference to the first and second stages and therefore will not be explained in detail herein. It should be noted, however, that resistance $R_{18}$ is added to the fourth stage so that the emitter bias in the fourth stage is substantially the same as the base bias in the third stage. (The latter condition is necessary if the base to emitter drop of the fourth stage is to control the collector to base difference in the third stage.)

The good high frequency performance of the transistorized differential amplifier shown in the drawing is achieved by two types of high frequency feedback. In stage 1, an 18 picofarad capacitance, $C_2$, is connected across the gain determining impedance. The capacitance, $C_2$, has no effect on the D.C. gain or the low frequency gain. However, at very high frequencies the capacitor lowers the impedance between the emitters of $Q_{2-1}$ and $Q_{1-1}$ thereby offsetting a reduction in gain which is normally caused at high frequency operation by the parasitic elements in the transistors. Capacitance $C_4$ serves the same purpose in stage 3 as capacitance $C_2$ in stage 1. High frequency performance is achieved within the second and fourth stages by the feedback inductances $L_1$, $L_2$, $L_3$ and $L_4$. At D.C. and low frequency operation, the inductive impedance is negligible and has no effect on the circuit. However, at high frequency operation the inductive impedance becomes greater thereby reducing the feedback current in the feedback loop. The latter condition offsets the reduction in gain which normally occurs at high frequency operation due to the parasitic elements of the transistors in the stage.

It should be apparent from the above description that the transistorized differential amplifier of the present invention achieves all the desired operating characteristics while at the same time eliminating all difficult to fabricate components which have heretofore been necessary to achieve the desired operating characteristics. While the invention has been particularly shown and described with reference to a preferred embodiment thereof, it will be understood by those skilled in the art that various changes in form and details may be made therein without departing from the spirit and scope of the invention.

I claim:

1. A transistorized differential amplifier comprising a pair of input terminals, a pair of output terminals and first, second, third and fourth stages of amplification, each of said stages comprising two differentially connected NPN transistors whereby the base terminals of the transistors are the stage inputs and the collector terminals are the stage outputs, said input terminals being connected directly to the inputs of said first stage, the inputs of said second, third, and fourth stages being connected directly by direct substantially zero impedance connections to the outputs of said first, second, and third stages respectively, said output terminals being connected directly to the outputs of said fourth stage, means including said direct connection between the outputs of one stage and the inputs of the next succeeding stage for maintaining the D.C. bias voltage between the collector and base of the transistors of at least said one stage equal to the forward base-to-emitter voltage drop of said transistors in said next succeeding stage.

2. The differential amplifier as claimed in claim 1 wherein said one stage is the first stage, further comprising means, including said direct connection between the outputs of said third stage and the inputs of said fourth stage for maintaining the D.C. bias voltage between the collector and base of said third stage transistors equal to the forward base-to-emitter voltage drop of the fourth stage transistors.

3. The differential amplifier as claimed in claim 2 further comprising feedback means between the outputs and inputs of said second stage for maintaining the D.C. bias on the collectors of said second stage transistor above the D.C. bias on the base of said second stage transistors, and feedback means between the outputs and inputs of said fourth stage for maintaining the D.C. bias on the collectors of said fourth stage transistors above the D.C. bias on the base of said fourth stage transistors.

4. The differential amplifier as claimed in claim 3 wherein the feedback means in said second stage comprise means for offsetting a decrease in gain at high frequency operation normally caused by parasitic elements in said second stage transistors, and the feedback means in said fourth stage comprise means for offsetting the decrease in gain at high frequency operation normally caused by parasitic elements in said fourth stage transistors.

5. The differential amplifier claimed in claim 4 wherein the first stage comprises a gain determining impedance connected between the emitters of said first stage transistors and means in parallel with the gain determining impedance for offsetting at high frequency operation the reduction in gain normally due to the parasitic elements in said first stage transistors, and the third stage comprises a gain determining impedance connected between the emitters of said third stage transistors and means in parallel with the gain determining impedance for offsetting at high frequency operation the reduction in gain normally due to the parasitic elements of said third stage transistors.

6. The differential amplifier as claimed in claim 5 wherein the means for offsetting in said first stage is a capacitance, and the means for offsetting in said third stage is a capacitance.

7. The differential amplifier as claimed in claim 6 wherein each of said feedback means is a series connection of a resistance and an inductance of less than 0.2 microhenry.

8. The differential amplifier as claimed in claim 7 wherein the means for maintaining the D.C. bias the collector and base of the stage one transistors comprises a low negative voltage power supply terminal, first and second resistances connecting the bases of said first stage transistors respectively, to the low voltage power supply terminal and means connecting the emitters of said second stage transistors to the low voltage power supply terminal.

9. The differential amplifier as claimed in claim 8 wherein the means for maintaining the D.C. bias voltage between the collector and base of said third stage transistors comprises a resistance connected between said low voltage power supply terminal and the connection between the emitters of said fourth stage transistors.

References Cited

UNITED STATES PATENTS 3,046,487 7/1962 Matzen et al. ---------- 330—19
3,239,770 3/1966 Taber ---------------- 330—15

ROY LAKE, Primary Examiner

LAWRENCE J. DAHL, Assistant Examiner

U.S. Cl. X.R.

330—26, 40

PO-1050
(5/69)

UNITED STATES PATENT OFFICE
CERTIFICATE OF CORRECTION

Patent No. 3,496,480 Dated February 17, 1970

Inventor(s) June Singletary, Jr.

It is certified that error appears in the above-identified patent and that said Letters Patent are hereby corrected as shown below:

Column 2, line 35, after "+15°" the term --C-- has been omitted.

Column 2, lines 42, 44, 45, and 46 the dashes should have been -- = -- (equal signs).

Column 2, line 44, "capacitance" should read --resistance--.

Column 6, line 10, after "bias" the words --voltage between-- have been omitted.

SIGNED AND
SEALED
JUL 21 1970

(SEAL)
Attest:

Edward M. Fletcher, Jr.
Attesting Officer

WILLIAM E. SCHUYLER, JR.
Commissioner of Patents